(12) United States Patent
Kawai

(10) Patent No.: US 6,954,123 B2
(45) Date of Patent: Oct. 11, 2005

(54) TUNING CIRCUIT

(75) Inventor: Kazuo Kawai, Tokyo (JP)

(73) Assignee: General Research of Electronics, Inc., Tokyo (JP)

(*) Notice: Subject to any disclaimer, the term of this patent is extended or adjusted under 35 U.S.C. 154(b) by 14 days.

(21) Appl. No.: 10/738,165

(22) Filed: Dec. 17, 2003

(65) Prior Publication Data

US 2004/0130416 A1 Jul. 8, 2004

(30) Foreign Application Priority Data

Dec. 24, 2002 (JP) ........................................ 2002-371776

(51) Int. Cl.[7] .............................. H03H 11/52; H03F 1/34
(52) U.S. Cl. ........................ 333/217; 333/213; 330/104
(58) Field of Search ................. 333/213, 214, 333/215, 216, 217; 331/116 R; 330/61 A, 98, 99, 100, 103, 104, 182, 293

(56) References Cited

U.S. PATENT DOCUMENTS 6,573,788 B2 * 6/2003 Oppelt ..................... 330/61 A
6,836,199 B2 12/2004 Kawai .......................... 333/214
6,870,447 B2 3/2005 Kawai .......................... 333/217

* cited by examiner

*Primary Examiner*—Dean Takaoka
(74) *Attorney, Agent, or Firm*—Flynn, Thiel, Boutell & Tanis, P.C.

(57) ABSTRACT

Selectivity Q of a tuning circuit is maximized by using a negative resistance circuit that is not influenced significantly by changes in conditions such as temperature, source voltage, etc. The tuning circuit operates stably and is constituted by a series resonance circuit and the negative resistance circuit connected thereto.

The negative resistance circuit can be a C-E dividing type circuit including a npn transistor as a first stage circuit and an emitter earth type amplifying circuit including a pnp transistor as a second stage circuit. A collector output of the pnp transistor is connected to an emitter of the npn transistor to constitute a negative feedback circuit and the collector output is divided and connected to a base of the npn transistor to constitute a positive feedback circuit.

Selectivity Q is improved by the negative resistance circuit provided by the negative feedback circuit.

5 Claims, 3 Drawing Sheets

TUNING CIRCUIT

BACKGROUND OF THE INVENTION

1. Field of the Invention

The present invention relates to an improved circuit construction of a tuning circuit for improving frequency selectivity Q of the tuning circuit by using a negative resistance circuit.

2. Description of the Related Art

In a radio receiver, there are methods for improving Q of a tuning circuit by using a negative resistance circuit as methods for improving a frequency characteristic of a tuning circuit used therein. One of them is a method for compensating a series resistance component of a tuning circuit with said negative resistance circuit by constituting the tuning circuit so that a driving circuit is connected to a terminal of a series resonance circuit consisting of an inductor and a capacitor connected to the inductor in series to add an input signal thereto and a negative resistance circuit is connected to other terminal thereof to ground it. Said method requires that design and adjustment is easy and operation is stable. As a conventional method satisfying this requirement there is a method disclosed in Japanese Patent Application No. 2003-218036. This method uses a differential amplifying circuit having two transistors whose emitters are connected directly, a low impedance output circuit as a emitter follower, a positive feedback circuit for positively feeding back an output signal of said output circuit to a same phase input side of the differential amplifying circuit directly, and a negative feedback circuit for negatively feeding back said output signal to an inverse phase input side of the differential amplifying circuit through a negative resistance setting resistor to obtain a negative resistance between this inverse phase input terminal and earth. According to this method, since a negative resistance circuit can be constituted by only well known circuits, circuit design and adjusted thereof are easy. Further since it is a simple construction circuit, it operates stably to a comparative high frequency.

However, since the above circuits requires three transistors, as a circuit having more simple construction a tuning circuit (Japanese Patent Application No. 2002-257367) was proposed. This tuning circuit is constituted by two stage transistor amplifying circuits wherein a first stage circuit is a C-E dividing type (collector-emitter dividing) circuit and a second stage circuit is an emitter follower. A positive feedback circuit is constituted by connecting an output of the emitter follower to an emitter of the first stage circuit directly or though a resistor and a negative feedback circuit is constituted by negatively feeding back an output of the second stage emitter follower to a base input of the first stage circuit through a resistor. According this construction a negative resistor can be obtained between the base input and earth.

Since the above described circuit is constructed by a circuit having only two transistors, it has more simple construction than that of the three transistor circuit and its adjustment is easy.

However, since any stage of the two stage transistor circuit does not take high amplification basically, a negative resistance value thereof varies largely by fine change of amplification of a transistor owing to variation of temperature or power voltage, there is a problem that it is necessary to keep usable condition such as temperature or power voltage, etc. in very stable condition.

SUMMARY OF THE INVENTION

An object of the invention is to improve selectivity Q of a tuning circuit by realizing a negative resistance circuit which is hard to be influenced by means of change of use conditions such as temperature, source voltage, etc., operates stably and has simple circuit construction.

In order to attain said object a first invention is characterized by a tuning circuit comprising a series resonance circuit, a driving circuit connected to a terminal of the series resonance circuit and a negative resistance circuit connected to other terminal thereof, said negative resistance circuit including a collector-emitter dividing type amplifying circuit constituted by a first transistor, an emitter earth type amplifying circuit constituted by a second transistor and connected to the collector-emitter dividing type amplifying circuit, a positive feedback circuit for positively feeding back an output of the emitter earth type amplifying circuit to the collector-emitter dividing type amplifying circuit and a negative feedback circuit for negatively feeding back an output of the emitter earth type amplifying circuit to the collector-emitter dividing type amplifying circuit, the other terminal of the series resonance circuit being connected to an input of the collector-emitter dividing type amplifying circuit and an output of the emitter earth type amplifying circuit being taken out as an output of the negative resistance circuit.

In the tuning circuit of the first invention said first transistor may be a npn or pnp transistor and said second transistor is a pnp or npn transistor.

A second invention is characterized by a tuning circuit comprising a series resonance circuit, a dividing circuit connected to a terminal of the series resonance circuit and a negative resistance circuit connected to other terminal thereof, said negative resistance circuit including a collector-emitter dividing type amplifying circuit constituted by a first transistor, an emitter earth type amplifying circuit constituted by a second transistor and connected to the collector-emitter dividing type amplifying circuit, an emitter follower circuit constituted by a third transistor and connected to the emitter earth type amplifying circuit, a positive feedback circuit for positively feeding back an output of the emitter follower circuit to the collector-emitter dividing type amplifying circuit and a negative feedback circuit for negatively feeding back the output of the emitter follower circuit to the collector-emitter dividing type amplifying circuit, the other terminal of the series resonance circuit being connected to an input of the collector-emitter dividing type amplifying circuit and an output of the emitter follower circuit being taken out as an output of the negative resistance circuit.

A third invention is characterized by a tuning circuit comprising a series resonance circuit, a driving circuit connected to a terminal of the series resonance circuit and a negative resistance circuit connected to other terminal thereof, said negative resistance circuit including a drain-source dividing type amplifying circuit constituted by a first field effect transistor, a source earth type amplifying circuit constituted by a second field effect transistor and connected to the drain-source dividing type amplifying circuit, a positive feedback circuit for positively feeding back an output of the source earth type amplifying circuit to the drain-source dividing type amplifying circuit and a negative feedback circuit for negatively feeding back the output of the source earth type amplifying circuit to the drain-source dividing type amplifying circuit, the other terminal of the series resonance circuit being connected to an input of the source earth type amplifying circuit and an output of the source earth type amplifying circuit being taken out as an output of the negative resistance circuit.

In the tuning circuit of the third invention, the first field effect transistor may be a n or p channel type field effect transistor and the second field effect transistor is a p or n channel type field effect transistor.

DESCRIPTION OF THE PREFERRED EMBODIMENTS

In order to constitute a negative resistance circuit which is hard to be influenced by means of change of use conditions such as temperature, source voltage, etc., it is necessary to utilize a transistor circuit amplification of which can be made large. So, firstly, it's reason will be explained.

Figure 4:
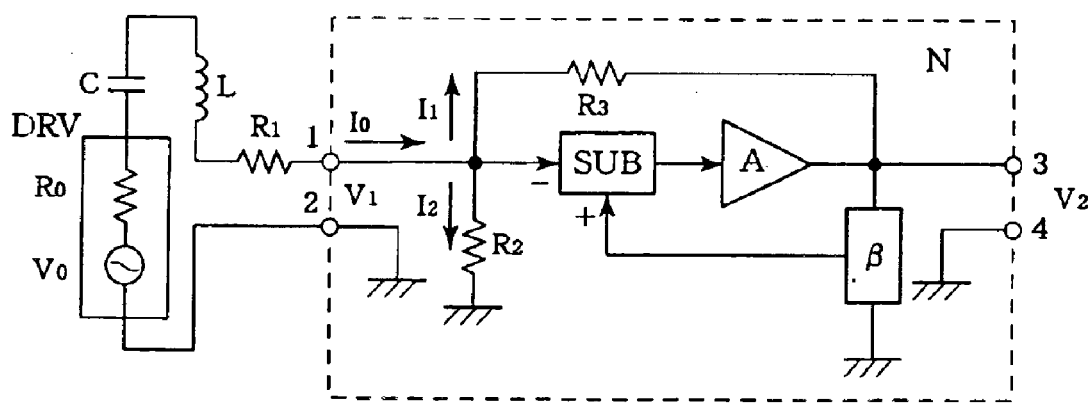
FIG. 4 is a circuit block diagram for explaining constructive principle of the drawing.

FIG. 4 shows a general circuit construction of a tuning circuit using a negative resistance circuit functionally. In the same figure, DRV is a driving circuit for the tuning circuit which is constituted by a same voltage $V_0$ and an inside resistor $R_0$ to drive the tuning circuit. C is a capacitor for the tuning circuit, L is an inductor for the tuning circuit, $R_1$ is a series resistance component of the inductor L and they constitute a series resonance circuit. N is a negative resistance circuit wherein 1 and 2 are input terminals thereof, SUB is a subtracting circuit. A is an inside amplifier having amplification A, β is a voltage dividing circuit having voltage dividing ratio β, $R_2$ is a resistor, $R_3$ is a resistor for setting negative feedback quantity, 3 and 4 is an output terminals of a negative resistance circuit N.

In the circuit of FIG. 4, the following equations (1) to (4) can be realized.

$$I_0 = I_1 + I_2 \quad (1)$$

$$I_1 = (V_1 - V_2)/R_3 \quad (2)$$

$$I_2 = V_1/R_2 \quad (3)$$

$$V_2 = (V_2\beta - V_1)A \quad (4)$$

From these equations, an input resistance of the negative resistance circuit N, that is, a negative resistance $R_N$ is shown by the following equation (5).

$$R_N = \frac{V_1}{I_0} = \frac{R_3}{1 + \frac{R_3}{R_2} + \frac{A}{1 - A\beta}} \quad (5)$$

Also, selectivity Q of the circuit is shown by the following equation (6).

$$Q = \overline{\omega} L (R_0 + R_1 + R_N) \quad (6)$$

Further, amplification $T(\overline{\omega}_0)$ of the circuit from $V_0$ to $V_2$ is indicated the following equation (7).

$$T(\omega_0) = \frac{V_2}{V_0} = -\frac{\frac{R_3}{R_{0+1}\left\{\frac{R_3}{R_2}+1\right\}+R_3}}{\frac{1-A\beta}{A}+\frac{R_{0+1}}{R_3\left\{\frac{R_{0+1}}{R_2}+1\right\}+R_{0+1}}} \quad (7)$$

Here, $R_{0+1} = R_0 + R_1$. From these equations the following result is obtained.

Now, in a case that $R_0 = 50\ \Omega$, $R_1 = 100\ \Omega$, $R_2 = 120\ \Omega$, $R_3 = 1\ k\Omega$, $T(\overline{\omega}_0) = 40$ dB, when the amplification A1 of the inside amplifier A is $A_1 = 150$, the voltage dividing ratio $\beta_1$ of the voltage dividing circuit β may be $\beta_1 = 0.0605$ from the equation (7) and when the amplification $A_2$ Of the inside amplifier A is $A_2 = 15$, the voltage dividing ratio $\beta_2$ may be $\beta_2 = 0.125$. So, when these amplifications reduce 10% from 150 and 15 respectively, the amplification $T(\overline{\omega}_0)$ of the circuit and Q become as follows.

TABLE 1

| | A (no reduction) | A (10% reduction) |
|---|---|---|
| $T(\overline{\omega}_o)$, Q | 40 dB ($A_1$ = 150), Q = 28.5 | 38.6 dB (0.9 $A_1$), Q = 24.6 |
| $T(\overline{\omega}_o)$, Q | 40 dB ($A_2$ = 15), Q = 28.5 | 31.1 dB (0.9 $A_2$), Q = 11.9 |

Therefore, the amplification $T(\overline{\omega}_0)$ of the circuit reduces by only 1.4 dB at 10% reduction of $A_1$ when $A_1 = 150$, but $T(\overline{\omega}_0)$ reduces 8.9 dB at 10% reduction of $A_2$ when $A_2 = 15$. Since the reason of such reduction exist in 1-Aβ in the equation (7), it is apparent that 1<<Aβ must be realized in order to make reduction of $T(\overline{\omega}_0)$ small.

Figure 5:
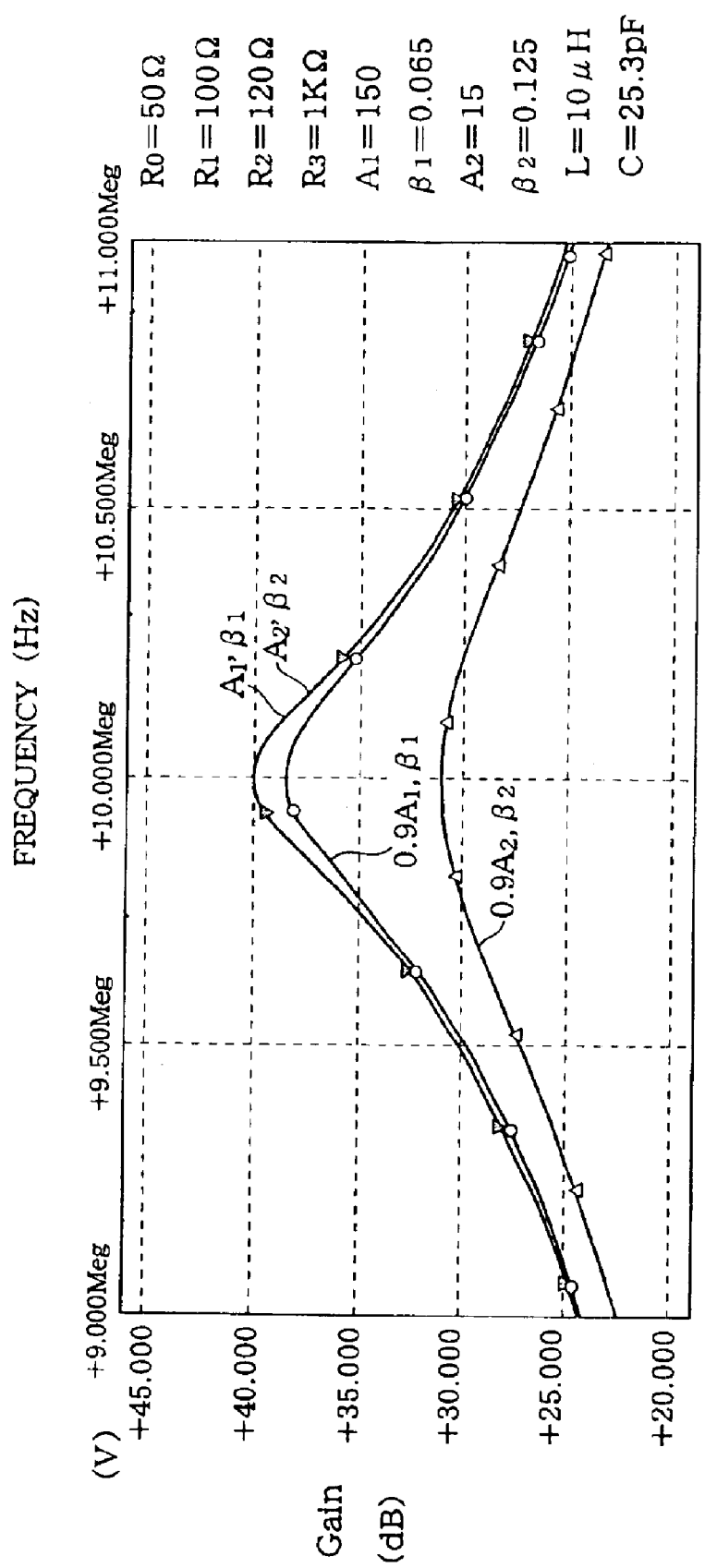
FIG. 5 is a drawing showing simulation result of frequency selectivity in a setting example of the circuit of FIG. 4.

In this case, the Q is obtained by inserting the negative resistance value $R_N$ obtained from the equation (5) into the equation (6) and in order to make a tuning frequency $f_0$ be 10 MHz L and C are L=10 μH, C=25.3 pF. Also, Q in case without a negative resistance circuit N is about 4.2. Further, in the circuit of FIG. 4, result simulating frequency selectivity characteristic in case using the above element values is shown in FIG. 5. From this figure it is obvious that the same result as the above case is obtained.

As above described since it is necessary that 1<<Aβ is realized with respect to an amplification factor of the inside amplifier A in order to make reduction of an amplification of the circuit due to A small, it is necessary to use an amplifying circuit having large amplification.

So, in the invention, a negative resistance circuit for a tuning circuit is constituted by a two stage transistor circuit.

Firstly, a C-E dividing type circuit having simple circuit construction capable of doing subtracting operation is used as a first stage transistor circuit. However, since an amplification factor of this circuit can not be made so large, a usual emitter amplifying circuit as a second stage transistor circuit is used. In order to make the whole circuit with this construction more simple, in case using a positive voltage source, if a C-E dividing type amplifying circuit using a bi-polar npn transistor is used as a first stage circuit and an emitter earth type amplifying circuit (in this case, an emitter is connected to the source) is used as a second stage circuit, the whole circuit becomes very simple construction because transistors in the first and second stages can be connected directly. Also, in case using a negative voltage source, a similar circuit can be obtained by using transistors whose polarity are inverse to that of the above transistors.

If an emitter earth type amplifying circuit as a second stage circuit is used, an amplification factor of the extent of 40 dB can be obtained easily without using a so large load resistor. Thus since an amplification factor which can not be obtained sufficiently by a first stage C-E dividing circuit can be covered sufficiently with a amplification factor of the second stage circuit, an amplification factor and a wide band characteristic can be ensured enough and thus a stable negative resistance circuit for a tuning circuit can be constituted.

Figure 1:
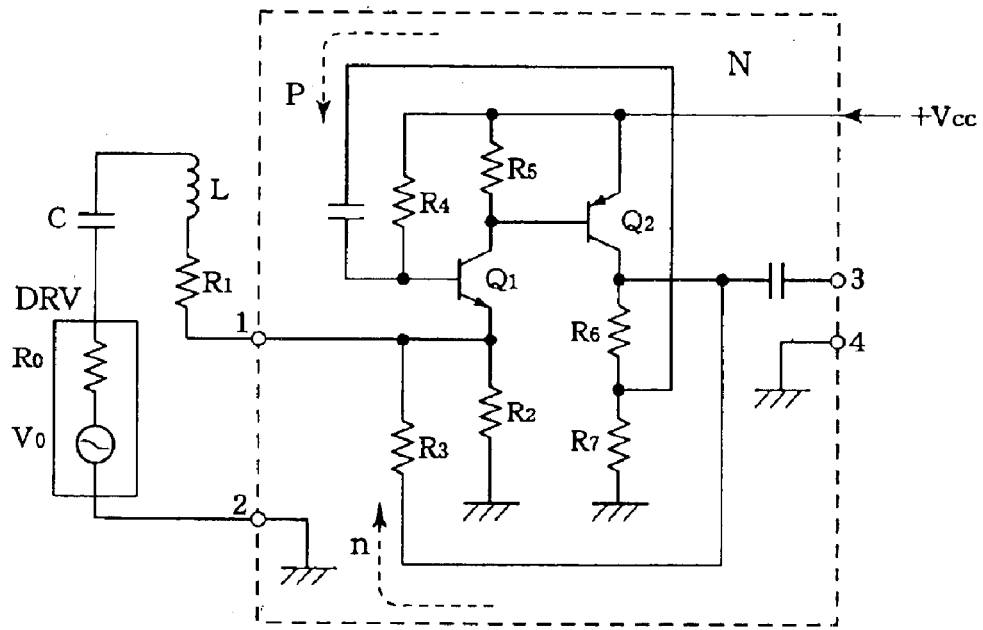
FIG. 1 is a circuit diagram showing an embodiment of the present invention.

FIG. 1 shows an embodiment of a tuning circuit of the invention based on the above described construction principle. In the same figure, DRV is a driving circuit comprising of a voltage source $V_0$ and an inside resistor $R_0$, C and L are a capacitor and an inductor constituting a series resonance circuit, $R_1$ is a series resistance component of the inductor L, and N is a negative resistance circuit wherein 1 and 2 are input terminals thereof, 3 and 4 are output terminals thereof, and $R_2$ to $R_7$ are resistors. $Q_1$ is a npn transistor to constitute a C-E dividing type amplifying circuit and $Q_2$ is a pnp transistor to constitute an emitter earth type amplifying circuit. Both circuits are connected directly and the whole circuit is simplified.

An emitter output of the transistor $Q_1$ is connected to the input terminal 1 and an collector output thereof is connected to a base of the transistor $Q_2$ respectively and a collector output of the transistor $Q_2$ as an amplified output of the negative resistance circuit is connected to the output terminal 3.

A collector output of the transistor $Q_2$ is connected to a base of the transistor $Q_1$ through the resistors $R_6$ and $R_7$ for voltage dividing, and to an emitter of the transistor Q1 through the resistor $R_3$ to constitute a negative feedback circuit n. Negative feedback quantity of the negative feedback circuit n is determined with dividing ratio of the resistors $R_2$, $R_3$ and positive feedback quantity of the positive feedback circuit p corresponds to β described above and is determined with dividing ratio of the resistors $R_6$, $R_7$. Also, the resistor $R_2$ is an effective input transistor containing a resistor connected between the emitter of the transistor $Q_1$ and earth.

According to arrangement described above, it is possible to improve frequency selectivity of a tuning circuit and to obtain an amplified output of the tuning circuit at the second stage transistor $Q_2$ by providing negative resistance at an emitter terminal of the first stage transistor $Q_1$.

Figure 2:
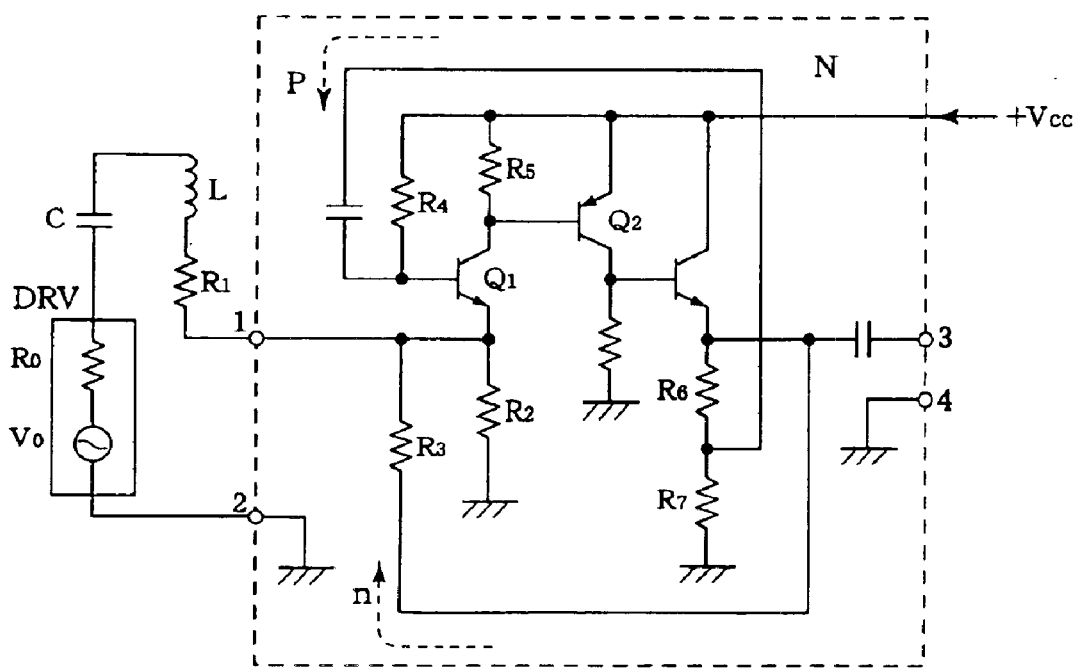
FIG. 2 is a circuit diagram showing other embodiment of the present invention.

FIG. 2 shows other embodiment of a tuning circuit of the invention wherein the same reference numerals as those in FIG. 1 the same or similar represent circuit parts therein. In the same figure, $Q_3$ is a npn transistor to constitute an emitter follower and is connected to a collector of the transistor $Q_2$ directly. If a load resistor connected to the output terminals 3, 4 is considerably small in the circuit of FIG. 1, predetermined amplification of the emitter earth type amplifying circuit $Q_2$ can not be obtained and in such case, large amplification of the circuit $Q_2$ can be obtained by adding the emitter follower $Q_3$ thereto as shown in FIG. 2.

Figure 3:
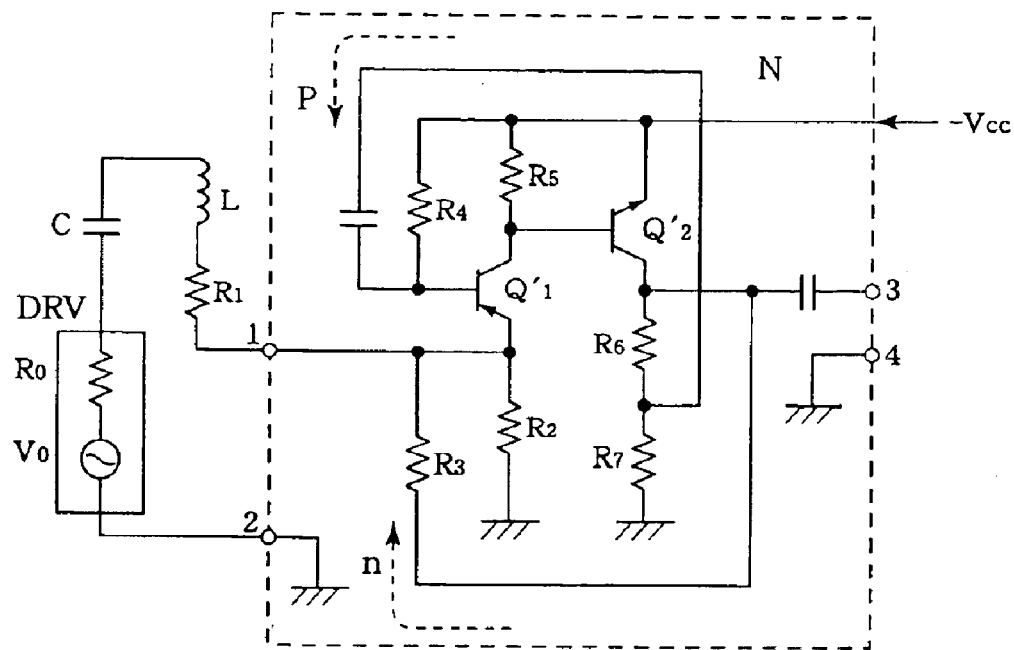
FIG. 3 is a circuit diagram showing further other embodiment of the drawing.

FIG. 3 shows further other embodiment of a tuning circuit of the invention wherein a transistor $Q'_1$ in a first stage is a pnp transistor and a transistor $Q'_2$ in a second stage is a npn transistor and the circuit has the same construction as that in FIG. 1 except types of all transistors in the circuit are inverse to those in FIG. 1. Further, types of each transistor in the circuit of FIG. 2 may be made inverse.

Furthermore, in each embodiment described above, a bi-polar transistor may be used but a field effect transistor (FET) may be substituted for this. In this case, a collector, a base, an emitter of the bi-polar transistor may correspond to a drain, a gate, a source of the field effect transistor respectively. An example of an circuit construction thereof will be explained as follows.

That is, in a tuning circuit wherein an input signal is applied to a terminal of a series resonance circuit having an inductor and a capacitor connected thereto in series and other terminal thereof is earthed through a negative resistance circuit, said negative resistance circuit is constituted by a n channel field effect transistor to provide a drain-source dividing type amplifying circuit as a first stage circuit and a p channel field effect transistor to provide a source earth type amplifying circuit as a second stage circuit. A source output of the first stage circuit is connected to an input terminal of the negative resistance circuit and a drain output thereof is connected to a gate of the second stage circuit respectively. A source output of the second stage circuit is taken out from an output terminal as an amplified output of the negative resistance circuit and the amplified output is divided. A divided output is connected to a gate of a first stage FET transistor to constitute a positive feed back circuit. Further, the amplified output is connected to a source of the first stage FET transistor through a resistor to constitute a negative feedback circuit.

According to arrangement described above, it is possible to improve frequency selectivity (Q) of a tuning circuit by providing a negative resistance at a source terminal of the first stage FET transistor and to obtain an amplified out at a drain output of the second stage FET transistor. In the above example, a FET transistor having channel inverse to that of said FET transistor may be used.

As explained in detail according to the invention, since it ca be done to constitute a negative resistance circuit which is hard to be influenced by means of change of use condition such as temperature, source voltage, etc., operates stably and has simple circuit construction, it is possible to improve selectivity Q of a tuning circuit and to use it stably.

What is claimed is:

1. A tuning circuit comprising a series resonance circuit, a driving circuit connected to a terminal of the series resonance circuit and a negative resistance circuit connected to other terminal thereof;

said negative resistance circuit including a collector-emitter dividing type amplifying circuit constituted by a first transistor, an emitter earth type amplifying circuit constituted by a second transistor and connected to the collector-emitter dividing type amplifying circuit, a positive feedback circuit for positively feeding back an output of the emitter earth type amplifying circuit to the collector-emitter dividing type amplifying circuit and a negative feedback circuit for negatively feeding back an output of the emitter earth type amplifying circuit to the collector-emitter dividing type amplifying circuit, the other terminal of the series resonance circuit being connected to an input of the collector-emitter dividing type amplifying circuit and an output of the emitter earth type amplifying circuit being taken out as an output of the negative resistance circuit.

2. A tuning circuit according to claim 1 wherein said first transistor is a npn or pnp transistor and said second transistor is a pnp or npn transistor.

3. A tuning circuit comprising a series resonance circuit, a driving circuit connected to a terminal of the series resonance circuit and a negative resistance circuit connected to other terminal thereof;

said negative resistance circuit including a collector-emitter dividing type amplifying circuit constituted by a first transistor, an emitter earth type amplifying circuit constituted by a second transistor and connected to the collector-emitter dividing type amplifying circuit, an emitter follower circuit constituted by a third transistor and connected to the emitter earth type amplifying circuit, a positive feedback circuit for positively feeding back an output of the emitter follower circuit to the collector-emitter dividing type amplifying circuit and a negative feedback circuit for negatively feeding back the output of the emitter follower circuit to the collector-emitter dividing type amplifying circuit, the other terminal of the series resonance circuit being connected to an input of the collector-emitter dividing type amplifying circuit and an output of the emitter follower circuit being taken out as an output of the negative resistance circuit.

4. A tuning circuit comprising a series resonance circuit, a driving circuit connected to a terminal of the series resonance circuit and a negative resistance circuit connected to other terminal thereof;

said negative resistance circuit including a drain-source dividing type amplifying circuit constituted by a first field effect transistor, a source earth type amplifying circuit constituted by a second field effect transistor and connected to the drain-source dividing type amplifying circuit, a positive feedback circuit for positively feeding back an output of the source earth type amplifying circuit to the drain-source dividing type amplifying circuit and a negative feedback circuit for negatively feeding back the output of the source earth type amplifying circuit to the drain-source dividing type amplifying circuit, the other terminal of the series resonance circuit being connected to an input of the source earth type amplifying circuit and an output of the source earth type amplifying circuit being taken out as an output of the negative resistance circuit.

5. A tuning circuit according to claim 4 wherein the first field effect transistor is a n or p channel type field effect transistor and the second field effect transistor is a p or n channel type field effect transistor.

* * * * *